(12) United States Patent
Mittal et al.

(10) Patent No.: US 9,943,008 B2
(45) Date of Patent: Apr. 10, 2018

(54) THERMAL MODULATION OF AN ELECTRONIC DEVICE

(71) Applicant: QUALCOMM Incorporated, San Diego, CA (US)

(72) Inventors: Rajat Mittal, San Diego, CA (US); Mehdi Saeidi, San Diego, CA (US); Vivek Sahu, San Diego, CA (US); Ryan Coutts, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 15/087,864

(22) Filed: Mar. 31, 2016

(65) Prior Publication Data

US 2017/0290194 A1 Oct. 5, 2017

(51) Int. Cl.
*H05K 7/20* (2006.01)
*H01L 41/09* (2006.01)
*H01L 41/04* (2006.01)

(52) U.S. Cl.
CPC ......... *H05K 7/2039* (2013.01); *H01L 41/042* (2013.01); *H01L 41/0973* (2013.01)

(58) Field of Classification Search
CPC .............. H06K 1/0201; H05K 7/20454; H05K 7/20472
USPC .......................................................... 361/714
See application file for complete search history.

(56) References Cited

U.S. PATENT DOCUMENTS

| | | | |
|---|---|---|---|
| 7,031,155 B2 | 4/2006 | Sauciuc et al. | |
| 9,006,956 B2 | 4/2015 | Li et al. | |
| 9,092,204 B2 | 7/2015 | Chou et al. | |
| 2011/0168378 A1* | 7/2011 | Hsu ......................... | B64G 1/50 165/276 |
| 2012/0219399 A1* | 8/2012 | Suzuki ..................... | G06F 1/206 415/1 |
| 2014/0268573 A1* | 9/2014 | Barnes ............... | H05K 7/20409 361/707 |
| 2015/0055295 A1 | 2/2015 | Chang et al. | |
| 2015/0173241 A1 | 6/2015 | Hsu et al. | |
| 2015/0264842 A1* | 9/2015 | Song .................... | H05K 9/0032 361/714 |

* cited by examiner

*Primary Examiner* — Mukund G Patel
(74) *Attorney, Agent, or Firm* — Muncy, Geissler, Olds & Lowe, P.C.

(57) ABSTRACT

An electronic device includes an integrated circuit, a flexible heat spreader, an actuator, and a controller. The actuator is coupled to the flexible heat spreader and the controller is configured to control the actuator between a first actuation mode and a second actuation mode. When in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit. When in the second actuation mode, the actuator positions the flexible heat spreader in thermal contact with the integrated circuit without the air gap there between to reduce the thermal impedance between the flexible heat spreader and the integrated circuit.

24 Claims, 8 Drawing Sheets

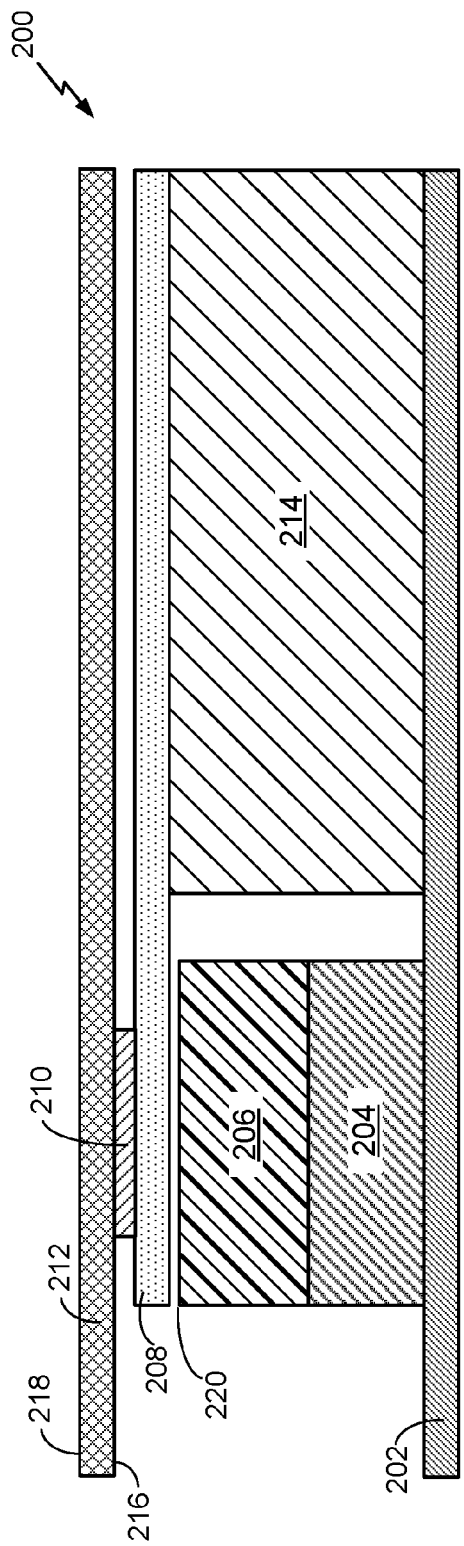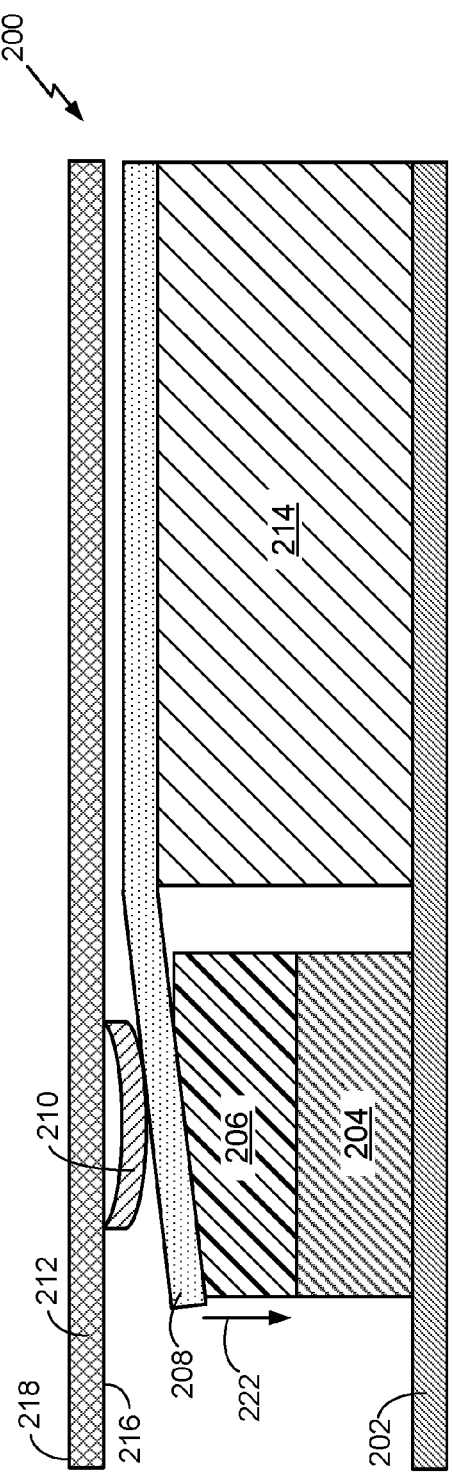

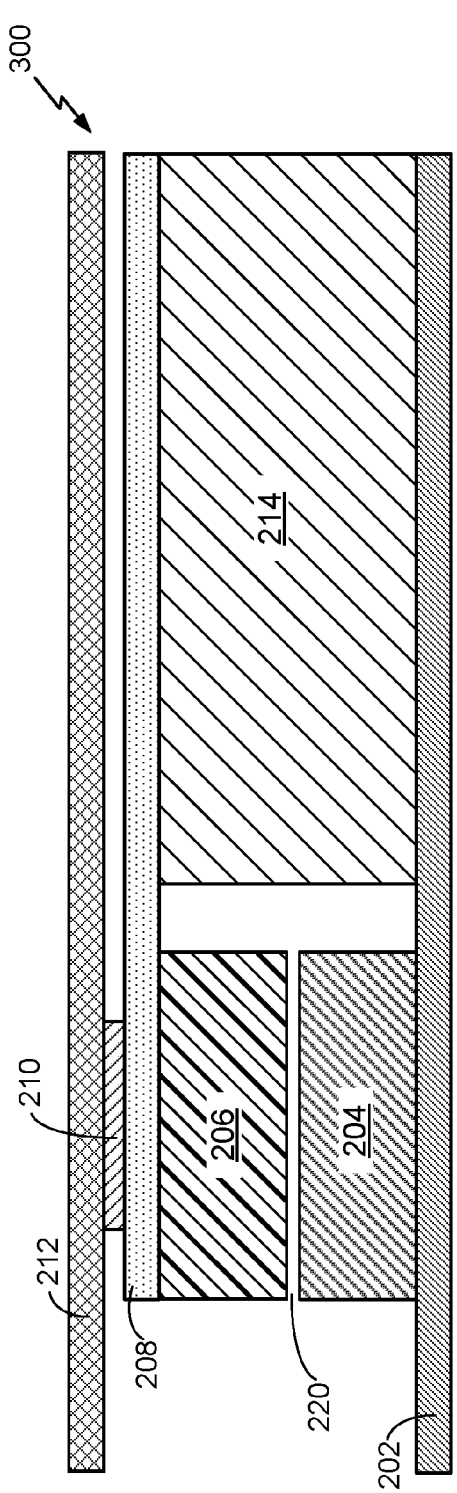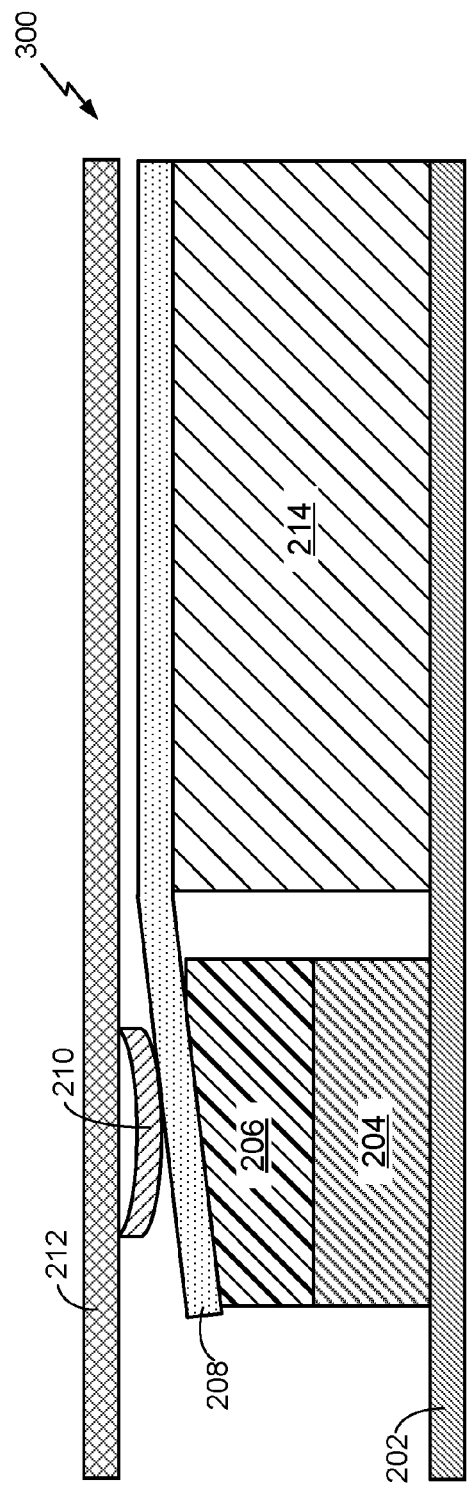

THERMAL MODULATION OF AN ELECTRONIC DEVICE

FIELD OF DISCLOSURE

This disclosure relates generally to heat dissipation in an electronic device, and in particular, but not exclusively to the dynamic thermal modulation of heat dissipation path of an electronic device.

BACKGROUND

With the rapid development in the electronic fields in recent years, the performance of various electronic devices has largely been upgraded to provide higher and higher operating and data processing speeds. With the constantly increased operating speed of the chipsets and the constantly increased number of chips inside the electronic devices, more heat is produced by the electronic devices during their operation. Typically, the heat must be dissipated away from the chips to avoid damage and/or reduced performance.

Some conventional electronic devices employ a cooling fan disposed within an exterior housing of the electronic device to create airflow to dissipate heat produced by the electronic elements of the device. However, due to a current miniaturization trend, current electronic devices often have limited internal space for mounting a cooling fan and/or for creating sufficient airflow to dissipate the necessary heat. In addition, conventional cooling fans consume a relatively large amount of power, which decreases the performance of portable electronic devices which may rely on batteries for operation.

Other conventional electronic devices may utilize a statically fixed heat spreader between a surface of one or more chipsets and the exterior housing of the electronic device. The heat spreader transfers heat generated by the chipset to the exterior housing for dissipation out of the electronic device. However, a user's experience of the electronic device may be governed, in part, based on the user's touch perception of a temperature of the electronic device. For example, if a temperature of the exterior housing of the electronic device (e.g., mobile phone) is too high, then the user may experience discomfort while holding the electronic device in their hand and/or when holding against their face/ear. Furthermore, a user may perceive a warm or hot device as malfunctioning or as not operating correctly.

SUMMARY

The following presents a simplified summary relating to one or more aspects and/or embodiments associated with the mechanisms disclosed herein for the thermal modulation of an electronic device. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary presents certain concepts relating to one or more aspects and/or embodiments relating to the mechanisms disclosed herein to thermally modulate an electronic device in a simplified form to precede the detailed description presented below.

According to one aspect, an electronic device includes an integrated circuit, a flexible heat spreader, an actuator, and a controller. The actuator is coupled to the flexible heat spreader and the controller is configured to control the actuator between a first actuation mode and a second actuation mode. When in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit. When in the second actuation mode, the actuator positions the flexible heat spreader in thermal contact with the integrated circuit without the air gap there between to reduce the thermal impedance between the flexible heat spreader and the integrated circuit.

According to another aspect, a method of thermally modulating an electronic device that includes an integrated circuit, a flexible heat spreader, and an actuator includes controlling the actuator between a first actuation mode and a second actuation mode. When in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit. When in the second actuation mode, the actuator positions the flexible heat spreader in thermal contact with the integrated circuit without the air gap there between to reduce the thermal impedance between the flexible heat spreader and the integrated circuit.

According to yet another aspect, an electronic device includes an integrated circuit, a heat spreading means for dispersing heat generated by the integrated circuit, an actuator means for positioning the heat spreading means in a first position while in a first actuation mode and in a second position while in a second actuation mode, and a means for controlling the actuator between the first actuation mode and the second actuation mode. When in the first actuation mode, the first position comprises the flexible heat spreader positioned with an air gap between the flexible heat spreader and the integrated circuit such that the flexible heat spreader is thermally separated from the integrated circuit to increase a thermal impedance between the flexible heat spreader and the integrated circuit. When in the second actuation mode, the second position comprises the flexible heat spreader positioned in thermal contact with the integrated circuit without the air gap there between to reduce the thermal impedance between the flexible heat spreader and the integrated circuit.

According to still another aspect, a wireless mobile station includes an integrated circuit, a flexible heat spreader, an actuator, and a controller. The integrated circuit is disposed within an exterior housing of the wireless mobile station and the flexible heat spreader includes a structure configured to disperse heat generated by the integrated circuit to at least the exterior housing. The structure may include a graphite sheet, a metal sheet, a copper sheet, or a mid-frame of the wireless mobile station. The actuator includes a piezo electric layer coupled to the flexible heat spreader and the controller is configured to control the actuator between a first actuation mode and a second actuation mode. The controller is configured to switch the actuator to the second actuation mode by applying an actuation voltage to the piezo electric layer and to switch the actuator to the first actuation mode by removing the actuation voltage from the piezo electric layer. When in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit, where the piezo electric layer is configured to have a planar non-curved shape when the actuator is in the first actuation mode. When in the second actuation mode, the actuator positions the flexible heat spreader in thermal contact with the integrated circuit without the air gap there between to reduce the thermal impedance between the flexible heat spreader and the integrated circuit, where the piezo electric layer is configured to have a curved shape when the actuator is in the second actuation mode.

According to another aspect, a non-transitory computer-readable storage medium includes computer-executable instructions recorded thereon to thermally modulate an electronic device that includes an integrated circuit, a flexible heat spreader, and an actuator. Executing the computer-executable instructions on one or more processors causes the one or more processors to control the actuator between a first actuation mode and a second actuation mode. When in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit. When in the second actuation mode, the actuator positions the flexible heat spreader in thermal contact with the integrated circuit without the air gap there between to reduce the thermal impedance between the flexible heat spreader and the integrated circuit.

BRIEF DESCRIPTION OF THE DRAWINGS

The accompanying drawings are presented to aid in the description of embodiments of the invention and are provided solely for illustration of the embodiments and not limitation thereof.

FIGS. 2A and 2B illustrate an example electronic device in a first actuation mode and second actuation mode, respectively, according to aspects of the disclosure.

FIGS. 3A and 3B illustrate another example electronic device in a first actuation mode and second actuation mode, respectively, according to aspects of the disclosure.

DETAILED DESCRIPTION

Various aspects are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of non-transitory computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter.

Figure 1:
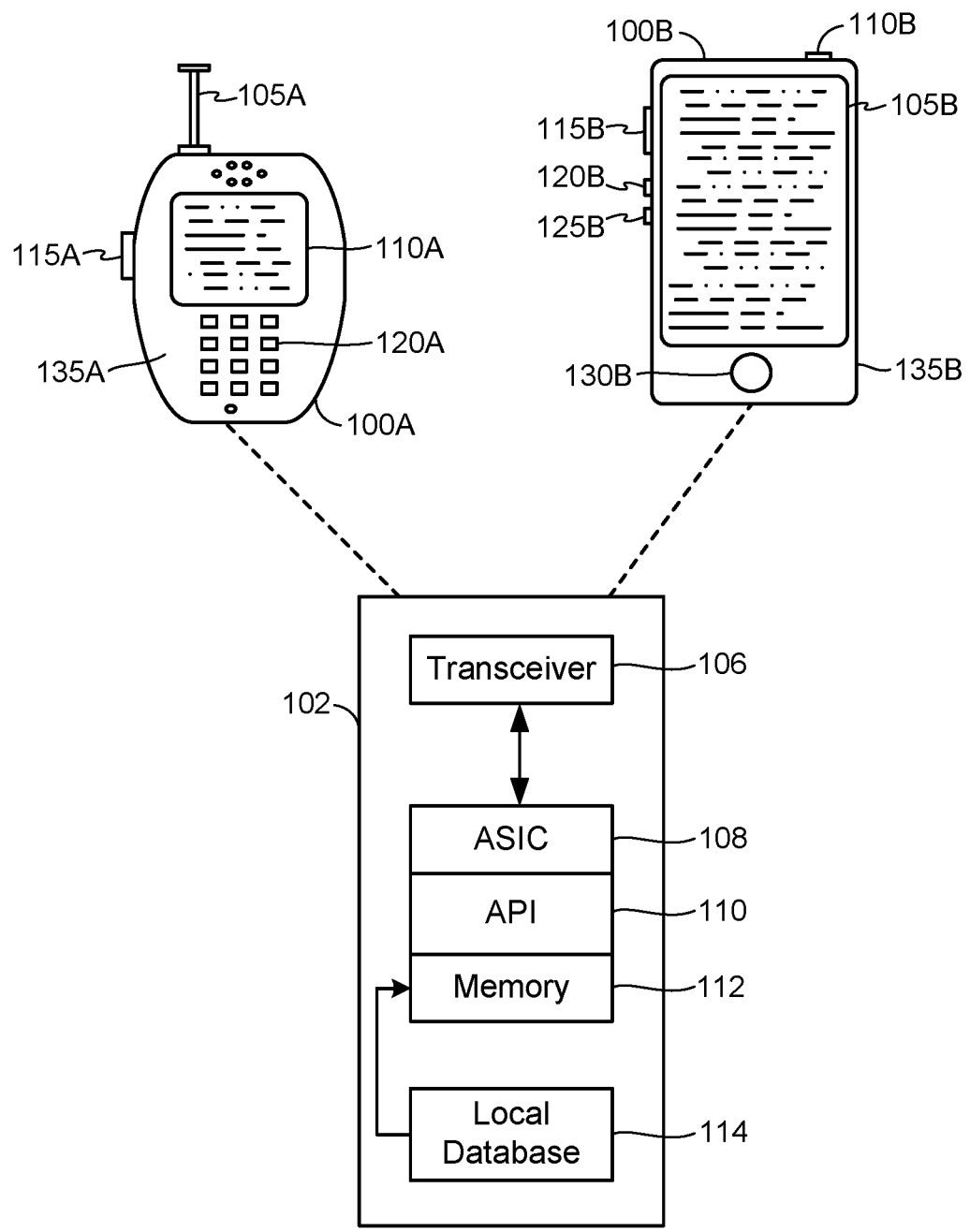
FIG. 1 illustrates examples of electronic devices, according to aspects of the disclosure.

FIG. 1 illustrates examples of electronic devices 100A and 100B in accordance with aspects of the present disclosure. In some examples, electronic devices 100A and 100B may herein be referred to as wireless mobile stations. The example electronic device 100A is illustrated in FIG. 1 as a calling telephone and electronic device 100B is illustrated as a touchscreen device (e.g., a smart phone, a tablet computer, etc.). As shown in FIG. 1, an exterior housing 135A of electronic device 100A is configured with an antenna 105A, a display 110A, at least one button 115A (e.g., a PTT button, a power button, a volume control button, etc.) and a keypad 120A among other components, not shown in FIG. 1 for clarity. An exterior housing 135B of electronic device 100B is configured with a touchscreen display 105B, peripheral buttons 110B, 115B, 120B and 125B (e.g., a power control button, a volume or vibrate control button, an airplane mode toggle button, etc.), at least one front-panel button 130B (e.g., a Home button, etc.), among other components, not shown in FIG. 1 for clarity. For example, while not shown explicitly as part of electronic device 100B, the electronic device 100B may include one or more external antennas and/or one or more integrated antennas that are built into the exterior housing 135B of electronic device 100B, including but not limited to WiFi antennas, cellular antennas, satellite position system (SPS) antennas (e.g., global positioning system (GPS) antennas), and so on.

While internal components of electronic devices such as the electronic devices 100A and 100B can be embodied with different hardware configurations, a basic high-level configuration for internal hardware components is shown as platform 102 in FIG. 1. The platform 102 can receive and execute software applications, data and/or commands transmitted from a radio access network (RAN) that may ultimately come from a core network, the Internet and/or other remote servers and networks (e.g., an application server, web URLs, etc.). The platform 102 can also independently execute locally stored applications without RAN interaction. The platform 102 can include a transceiver 106 operably coupled to an application specific integrated circuit (ASIC) 108, or other processor, microprocessor, logic circuit, or other data processing device. The ASIC 108 or other processor executes the application programming interface (API) 110 layer that interfaces with any resident programs in the memory 112 of the electronic device. The memory 112 can be comprised of read-only or random-access memory (RAM and ROM), EEPROM, flash cards, or any memory common to computer platforms. The platform 102 also can include a local database 114 that can store applications not actively used in memory 112, as well as other data. The local database 114 is typically a flash memory cell, but can be any secondary storage device as known in the art, such as magnetic media, EEPROM, optical media, tape, soft or hard disk, or the like.

In one aspect, wireless communications by electronic devices 100A and 100B may be based on different technologies, such as CDMA, W-CDMA, time division multiple access (TDMA), frequency division multiple access (FDMA), Orthogonal Frequency Division Multiplexing (OFDM), GSM, 2G, 3G, 4G, LTE, or other protocols that may be used in a wireless communications network or a data communications network. Voice transmission and/or data can be transmitted to the electronic devices from a RAN using a variety of networks and configurations. Accordingly, the illustrations provided herein are not intended to limit the embodiments of the invention and are merely to aid in the description of aspects of embodiments of the invention.

Accordingly, aspects of the present disclosure can include an electronic device (e.g., electronic device 100A, 100B, etc.) configured, and including the ability to perform the functions as described herein. As will be appreciated by those skilled in the art, the various logic elements can be embodied in discrete elements, software modules executed on a processor or any combination of software and hardware to achieve the functionality disclosed herein. For example, ASIC 108, memory 112, API 110 and local database 114 may all be used cooperatively to load, store and execute the various functions disclosed herein and thus the logic to perform these functions may be distributed over various elements. Alternatively, the functionality could be incorporated into one discrete component. Therefore, the features of the electronic devices 100A and 100B in FIG. 1 are to be considered merely illustrative and the invention is not limited to the illustrated features or arrangement.

As discussed above, a user's experience of the electronic device may be governed, in part, based on the user's touch perception of a temperature of the electronic device. For example, a sensed hotness of the electronic devices 100A or 100B by a user as the user touches the exterior housing 135A or 135B, respectively, may impact the user's experience with the electronic device 100A or 100B. That is, a perceived hotness may result in discomfort by the user as the user touches the exterior housing 135A or 135B. Accordingly, in some examples, the electronic devices 100A and 100B are configured to maintain a temperature of the exterior housing 135A and 135B, respectively, to less than a skin temperature limit. The skin temperature limit may be a temperature value at which a typical user of the electronic device would perceive that the exterior housing is too hot. In one implementation, the skin temperature limit is determined empirically prior to deployment of the electronic device for normal usage. In some aspects, the skin temperature limit of the electronic devices 100A and 100B may be in the range of about 40° C. to about 45° C.

In addition to maintaining the temperature of the exterior housing 135A and 135B, the electronic devices 100A and 100B, may be further configured to maintain the junction temperatures of one or more integrated circuits included within the exterior housings 135A and 135B. For example, one or more integrated circuits included in the electronic devices 100A and 100B may each have an associated junction temperature limit. In one aspect, the junction temperature limit is a maximum temperature at which an associated integrated circuit can operate without significant risk of damage or reduced performance due to overheating. In some aspects, the junction temperature limit of one or more integrated circuits included in the electronic devices 100A and 100B may be in the range of about 90° C. to about 105° C.

Conventional thermal designs which address maintaining the junction temperatures of the integrated circuits included within an electronic device typically perform poorly with regards to the skin temperature limit. That is, conventional thermal designs primarily directed to maintaining the junction temperatures may lead to an increase in the temperature of the exterior housing to past the skin temperature limit. Similarly, conventional thermal designs which address maintaining the temperature of the exterior housing typically perform poorly with regards to the junction temperature limits. That is, conventional thermal designs primarily directed to maintaining the exterior housing temperatures may lead to an increase in the temperature of one or more integrated circuits beyond their associated junction temperature limits.

Accordingly, the electronic devices 100A and 100B are configured to include a thermal circuit that modulates between maintaining two or more distinct temperature limits. For example, as will be discussed in more detail below, in one aspect, the electronic devices 100A and 100B may be configured to modulate a thermal circuit between maintaining both the junction temperature to below the junction temperature limit and the temperature of the exterior housing 135A or 135B to below the skin temperature limit. In one example, the thermal modulation may be based on what is being run on the device (e.g., a benchmark procedure, or other intensive operation). In another example, the thermal modulation may be based on monitored temperatures of the exterior housing 135A or 135B and/or of the integrated circuit.

FIGS. 2A and 2B illustrate an example electronic device 200 in a first actuation mode and second actuation mode, respectively, according to aspects of the disclosure. Electronic device 200 is one possible implementation of electronic devices 100A or 100B of FIG. 1.

The illustrated example of electronic device 200 includes a printed circuit board (PCB) 202, an integrated circuit 204, a thermal interface material (TIM) 206, a flexible heat spreader 208, an actuator 210, an exterior housing 212, and an electronic component 214. In one example, the PCB 202 is configured to mechanically support and electrically connect one or more active and/or passive electronic components and may include one or more substrates. PCB 202 may be a single-sided, a double-sided, or a multi-layer PCB. Integrated circuit 204 is shown as disposed on the PCB 202 and may be fixedly attached to the PCB 202 by way of one or more conductive pads, solder balls, leads, and/or wires. In one example, the integrated circuit 204 may be a system-on-chip (SoC), such as a mobile station modem (MSM) integrated circuit. The MSM integrated circuit may include multiple central processing unit (CPU) cores, a graphics processing unit (GPU), a wireless modem, and other hardware and/or hardware/software combinations that support one or more systems of the electronic device 200, such as a global positioning system (GPS) and/or a camera, etc.

TIM 206 is shown in the example of FIGS. 2A and 2B as disposed on and in thermal contact with a top surface of the integrated circuit 204. TIM 206 may include any material that enhances the thermal coupling between integrated circuit 204 and flexible heat spreader 208. In one example, TIM 206 includes a thermal grease or thermal gap filler. In one aspect, TIM 206 may be polymer-based or solder-based.

The illustrated example of flexible heat spreader 208 is shown as coupled to actuator 210. In some implementations, flexible heat spreader 208 includes a structure that is configured to disperse heat generated by the integrated circuit 204. Example structures utilized by the flexible heat spreader 208 may include a graphite sheet, a metal sheet, a copper sheet, and/or a mid-frame of the electronic device 200. Actuator 210 may include a piezo electric layer that is configured to change shapes in response to an actuation voltage applied to the piezo electric layer. For example, the piezo electric layer of actuator 210 in FIG. 2B has a curved shape in response to the actuation voltage applied to the piezo electric layer, whereas the piezo electric layer of actuator 210 in FIG. 2A has a planar non-curved shape in the absence of the actuation voltage.

Exterior housing 212 is shown as including an interior surface 216 and an exterior surface 218. Exterior housing 212 may correspond to the exterior housing 135A and 135B of electronic devices 100A and 100B, respectively, of FIG. 1. In one example, the exterior housing 212 includes metal. As shown in FIGS. 2A and 2B, the actuator 210 is disposed between the interior surface 216 of the exterior housing 212 and the flexible heat spreader 208. Exterior surface 218 may be the surface upon which a user of the electronic device 200 touches the electronic device and thus the surface upon which the temperature of the electronic device 200 is sensed by the user.

As shown in FIGS. 2A and 2B, flexible heat spreader 208 is disposed on an electronic component 214. In one example, electronic component 214 is a battery, but may include any other passive or active electronic components of the electronic device 200.

Electronic device 200 further includes a controller (not shown) that is configured to control the actuator 210 between a first actuation mode and a second actuation mode. As mentioned above, the piezo electric layer of actuator 210 is configured to change shapes in response to an actuation voltage applied to the piezo electric layer. Thus, in one example, the controller is coupled to the actuator 210 to switch the actuator 210 to the second actuation mode by applying the actuation voltage to the piezo electric layer. The controller further switches the actuator 210 to the first actuation mode by removing the actuation voltage from the piezo electric layer of actuator 210. The controller may include one or more active and/or passive electronic components configured to control the actuator 210. In one example, the controller is included within integrated circuit 204. In another example, the controller is located elsewhere within electronic device 200, such as disposed on or within PCB 202.

As mentioned above, FIG. 2A illustrates the electronic device 200 while the actuator 210 is in the first actuation mode. When in the first actuation mode, the actuator 210 positions the flexible heat spreader 208 with an air gap 220 between the flexible heat spreader 208 and the integrated circuit 204 such that the flexible heat spreader 208 is thermally separated from the integrated circuit 204 to increase a thermal impedance between the flexible heat spreader 208 and the integrated circuit 204. More particularly, when in the first actuation mode of FIG. 2A, the actuator 210 positions the flexible heat spreader 208 with the air gap 220 between the flexible heat spreader 208 and the TIM 206 such that the flexible heat spreader 208 is physically separated from the TIM 206. Increasing the thermal impedance between the flexible heat spreader 208 and the integrated circuit 204 decreases the transfer of thermal energy from the integrated circuit 204 to flexible heat spreader 208 and thus, reduces the amount of thermal energy dispersed by flexible heat spreader 208 to other areas of the electronic device 200, such as the exterior housing 212. Thus, in one example, the first actuation mode may be utilized by electronic device 200 to maintain a temperature of one or more other components (e.g., the exterior housing) to less than an associated temperature limit of the other component (e.g., the skin temperature limit).

FIG. 2B illustrates the electronic device 200 while the actuator 210 is in the second actuation mode. When in the second actuation mode, the actuator 210 positions the flexible heat spreader 208 in thermal contact with the integrated circuit 204 without an air gap there between (i.e., without air gap 220) to reduce the thermal impedance between the flexible heat spreader 208 and the integrated circuit 204. More particularly, when in the second actuation mode of FIG. 2B, the actuator 210 positions the flexible heat spreader 208 in physical contact with the TIM 206 without the air gap 220 there between. Decreasing the thermal impedance between the flexible heat spreader 208 and the integrated circuit 204 increases the transfer of thermal energy from the integrated circuit 204 to flexible heat spreader 208 and thus, increases the amount of thermal energy dispersed by flexible heat spreader 208 away from integrated circuit 204. Thus, in one example, the second actuation mode may be utilized by electronic device 200 to maintain a junction temperature of the integrated circuit 204 to less than an associated junction temperature limit of the integrated circuit 204.

As further shown in FIG. 2B, while in the second actuation mode, the actuator 210 may apply and maintain a force 222 against the flexible heat spreader 208 to reduce a contact impedance between the TIM 206 and the integrated circuit 204. The pressure on TIM 206 due to force 222 reduces the contact impedance between the TIM 206 and the integrated circuit 204 and may further increase the transfer of thermal energy from integrated circuit 204 to flexible heat spreader 208.

FIGS. 3A and 3B illustrate another example electronic device 300 in a first actuation mode and second actuation mode, respectively, according to aspects of the disclosure. Electronic device 200 is one possible implementation of electronic devices 100A or 100B of FIG. 1. Electronic device 300 is similar to electronic device 200 described above in FIGS. 2A and 2B. However, in electronic device 300 the TIM 206 is disposed on and in thermal contact with the flexible heat spreader 208 rather than on the integrated circuit 204, as in electronic device 200.

FIG. 3A illustrates the electronic device 300 while the actuator 210 is in the first actuation mode. When in the first actuation mode, the actuator 210 positions the flexible heat spreader 208 with the air gap 220 between the TIM 206 and the integrated circuit 204 such that the TIM 206 is physically separated from the integrated circuit 204. Positioning the flexible heat spreader 208 such that the TIM 206 is physically separated from the integrated circuit 204 increases the thermal impedance between the flexible heat spreader 208 and the integrated circuit 204 and thus decreases the transfer of thermal energy from the integrated circuit 204 to flexible heat spreader 208.

FIG. 3B illustrates the electronic device 200 while the actuator 210 is in the second actuation mode. When in the second actuation mode, the actuator 210 positions the flexible heat spreader 208 such that the TIM 206 is in physical contact with the integrated circuit 204 without the air gap 220 there between. Positioning the flexible heat spreader 208 such that the TIM 206 is in physical contact with the integrated circuit 204 decreases the thermal impedance between the flexible heat spreader 208 and the integrated circuit 204 and thus increases the transfer of thermal energy from the integrated circuit 204 to flexible heat spreader 208.

Figure 4:
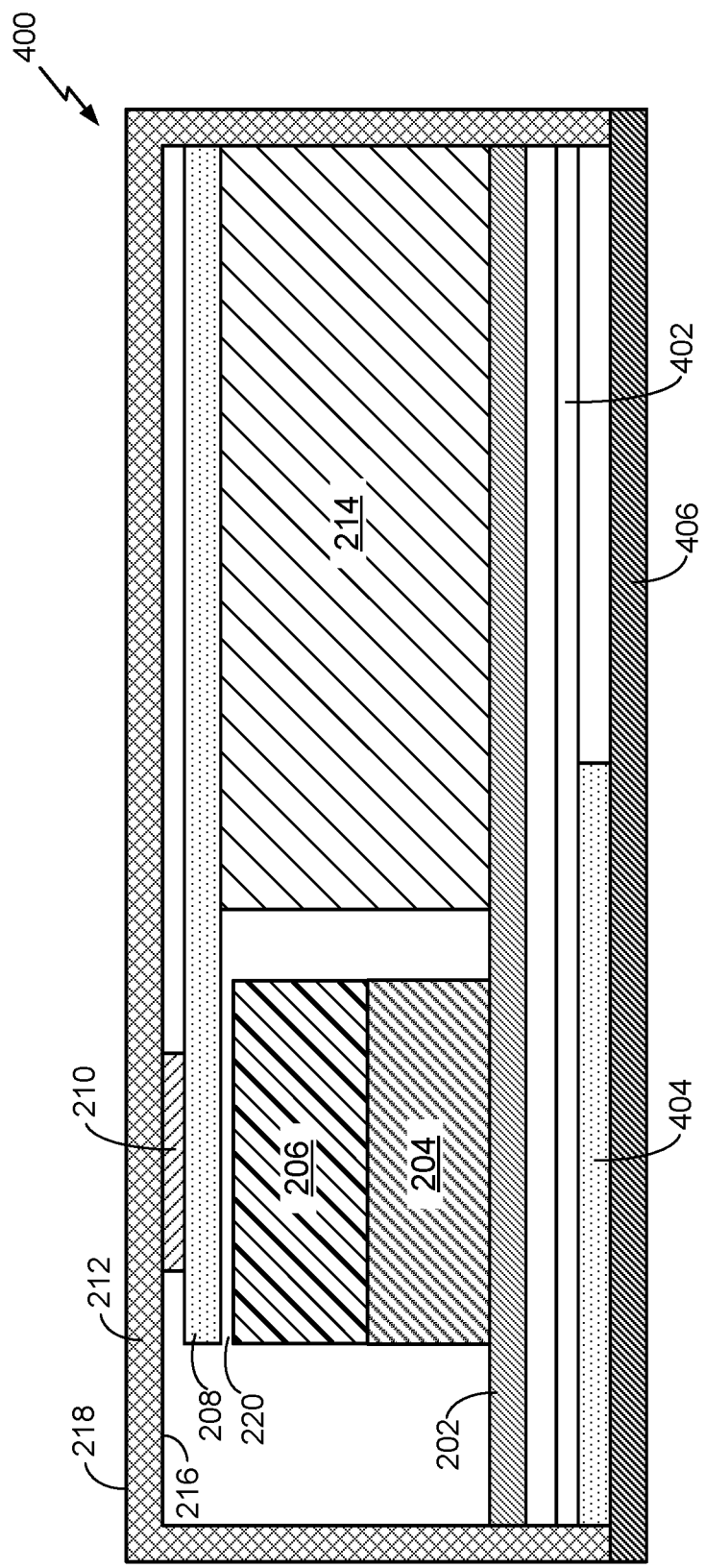
FIG. 4 illustrates an example electronic device, according to aspects of the disclosure.

FIG. 4 illustrates an example electronic device 400, according to aspects of the disclosure. Electronic device 400 is one possible implementation of electronic devices 100A or 100B of FIG. 1. Electronic device 400 is similar to electronic devices 200 and 300 described above in FIGS. 2A-3B and illustrates further components that may be included in an example electronic device. For example, the illustrated example of electronic device 400 includes PCB 202, integrated circuit 204, TIM 206, flexible heat spreader 208, actuator 210, exterior housing 212, and electronic component 214 (e.g., a battery), as well as a frame 402, a graphite sheet 404, and a display 406. In one example display 406 is a liquid crystal display (LCD) and may correspond to display 110A of electronic device 100A and/or display 105B of electronic device 100B, both of FIG. 1. Frame 402 may be configured to provide structural support to the electronic device 400. In one aspect, graphite sheet 404 may be configured as a heat spreader located proximate to a front side (i.e., display-side) of the electronic device 400.

As shown in FIG. 4, the display 406 is disposed on a front side of the electronic device 400, while the exterior surface 218 is illustrated as a back side of the electronic device 400. Thus, flexible heat spreader 208 may be disposed within exterior housing 212 proximate to exterior surface 218 such that the thermal energy dispersed by flexible heat spreader 208 is dispersed through the back side of the electronic device 400.

Figure 5A:
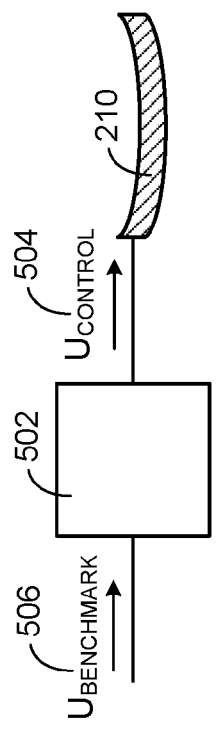
FIGS. 5A and 5B illustrate an example controller for use in an electronic device, according to aspects of the disclosure.
Figure 5B:
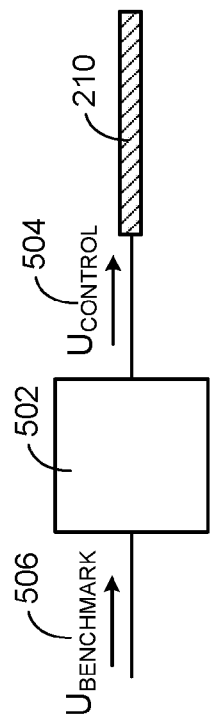

FIGS. 5A and 5B illustrate an example controller 502 for use in an electronic device, according to aspects of the disclosure. Controller 502 is one possible implementation of a controller included in electronic devices 100A, 100B, 200, 300, and 400 for controlling the actuator 210 between the first actuation mode and the second actuation mode. The controller 502 may include one or more active and/or passive electronic components configured to control the actuator 210. In one example, the controller is included within integrated circuit 204. In another example, the controller 502 is located elsewhere within the electronic device, such as disposed on or within PCB 202.

At certain times, the electronic device (e.g., electronic device 200) may be configured to perform a benchmarking procedure that includes the use of integrated circuit 204. The benchmarking procedure may include one or more operations performed by the integrated circuit 204 to measure a relative performance of the integrated circuit 204. During the benchmarking procedure, the temperature of the integrated circuit 204 may increase to the junction temperature limit relatively fast. Accordingly, the controller 502 is configured to switch the actuator 210 from the first actuation mode to the second actuation mode during a benchmarking procedure performed by the electronic device. Upon completion of the benchmarking procedure, the controller 502 is configured to switch the actuator 210 back to the first actuation mode. By way of example, FIGS. 5A and 5B illustrates controller 502 receiving a benchmark signal $U_{BENCHMARK}$ 506. The benchmark signal $U_{BENCHMARK}$ 506 indicates whether a benchmarking procedure is being performed on integrated circuit 204 by the electronic device.

In FIG. 5A, the benchmark signal $U_{BENCHMARK}$ 506 indicates that no benchmarking procedure is being performed on integrated circuit 204, and thus controller 502 generates a control signal $U_{CONTROL}$ 504 that controls actuator 210 in the first actuation mode. As mentioned above, actuator 210 includes a piezo electric layer that is configured to change shapes in response to an actuation voltage, where the absence of the actuation voltage allows piezo electric layer to maintain a substantially planar non-curved shape. Thus, in the example of FIG. 5A, the control signal $U_{CONTROL}$ 504 includes controlling the voltage applied to the piezo electric layer of actuator 210 to less than the actuation voltage (e.g., zero volts). Referring back to FIG. 2A, the first actuation mode includes maintaining the air gap 220 between the flexible heat spreader 208 and the integrated circuit 204 to increase the thermal impedance between the flexible heat spreader 208 and the integrated circuit 204. Thus, during normal operations (i.e., non-benchmarking procedures) the actuator 210 may be maintained in the first actuation mode to help keep the temperature of the exterior surface 218 to at or below the skin temperature limit.

In FIG. 5B, the benchmark signal $U_{BENCHMARK}$ 506 indicates that a benchmarking procedure is indeed being performed on integrated circuit 204, and thus controller 502 generates a control signal $U_{CONTROL}$ 504 that switches actuator 210 to the second actuation mode. As mentioned above, the piezo electric layer is configured to change to a curved shape in response to the actuation voltage. Thus, in the example of FIG. 5B, the control signal $U_{CONTROL}$ 504 includes controlling the voltage applied to the piezo electric layer of actuator 210 to greater than or equal to the actuation voltage. Referring back to FIG. 2B, the second actuation mode includes positioning the flexible heat spreader 208 in thermal contact with the integrated circuit 204 without an air gap there between (i.e., without air gap 220) to reduce the thermal impedance between the flexible heat spreader 208 and the integrated circuit 204. Thus, during benchmarking procedures the actuator 210 may be maintained in the second actuation mode to help keep the temperature of the integrated circuit 204 to at or below the junction temperature limit of the integrated circuit 204. In one example, the benchmark signal $U_{BENCHMARK}$ 506 may further indicate when the benchmarking procedure is completed, where in response thereto, the controller 502 may switch the actuator 210 back to the first actuation mode, as shown in FIG. 5A.

Figure 6A:
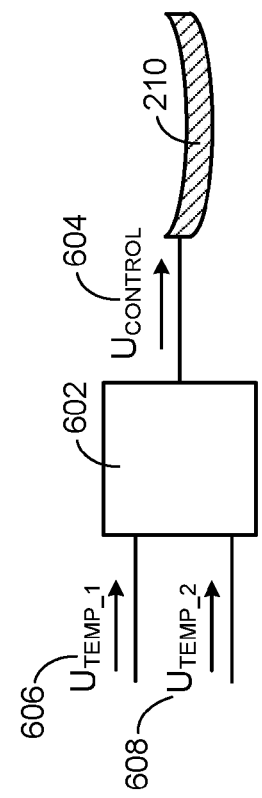
FIGS. 6A and 6B illustrate another example controller for use in an electronic device, according to aspects of the disclosure.
Figure 6B:
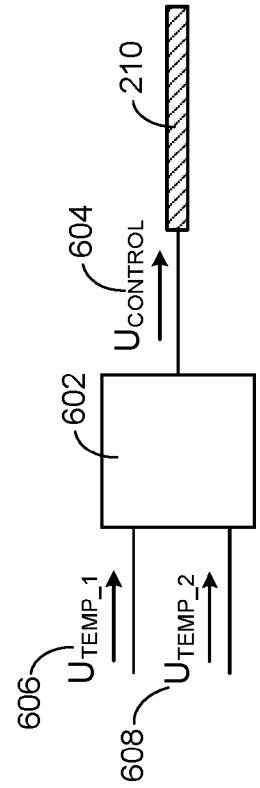

FIGS. 6A and 6B illustrate another example controller 602 for use in an electronic device, according to aspects of the disclosure. Controller 602 is one possible implementation of a controller included in electronic devices 100A, 100B, 200, 300, and 400 for controlling the actuator 210 between the first actuation mode and the second actuation mode. The controller 602 may include one or more active and/or passive electronic components configured to control the actuator 210. In one example, the controller is included within integrated circuit 204. In another example, the controller 602 is located elsewhere within the electronic device, such as disposed on or within PCB 202.

As shown in FIGS. 6A and 6B, the controller 602 is configured to receive a first temperature reading $U_{TEMP\_1}$ 606 and a second temperature reading $U_{TEMP\_2}$ 608. The first temperature reading $U_{TEMP\_1}$ 606 is representative of a temperature of the integrated circuit 204 and the second temperature reading $U_{TEMP\_2}$ 608 is representative of a second component of the electronic device. In one example, the second component may be the exterior housing 212 of electronic device 400. However, the second component may be any component of the electronic device 400, such as battery 214, display 406, another integrated circuit, and/or other passive or active electronic components. The controller is configured to switch the actuator 210 between the first actuation mode (i.e., FIG. 6A) and the second actuation mode (i.e., FIG. 6B) in response to the first temperature reading $U_{TEMP\_1}$ 606 and the second temperature reading $U_{TEMP\_2}$ 608.

In one example, the controller 602 is configured to switch the actuator 210 to the second actuation mode (i.e., FIG. 6B) if both the first temperature reading $U_{TEMP\_1}$ 606 is greater than or equal to a junction temperature limit of the integrated circuit 204 and the second temperature reading $U_{TEMP\_2}$ 608 is less than a second temperature limit associated with the second component (e.g., skin temperature limit of exterior housing 212). A first temperature reading $U_{TEMP\_1}$ 606 that is greater than or equal to a junction temperature limit of the integrated circuit 204 indicates that the integrated circuit 204 is too hot, where a second temperature reading $U_{TEMP\_2}$ 608 that is less than the second temperature limit associated with the second component indicates that there is room to transfer further thermal energy away from the integrated circuit 204 by way of flexible heat spreader 208. Thus, switching the actuator 210 to the second actuation mode in this case may provide for reducing the temperature of the integrated circuit 204, while still keeping the temperature of the second component to at or below the second temperature limit.

In another example, the controller 602 is configured to switch the actuator 210 to the first actuation mode (i.e., FIG. 6A) if both the first temperature reading $U_{TEMP\_1}$ 606 is less than a junction temperature limit of the integrated circuit 204 and the second temperature reading $U_{TEMP\_2}$ 608 of the second component is greater than or equal to a second temperature limit associated with the second component (e.g., skin temperature limit of exterior housing 212). A second temperature reading $U_{TEMP\_2}$ 608 that is greater than or equal to the second temperature limit associated with the second component indicates that the second component (e.g., exterior housing 212) is too hot, where a first temperature reading $U_{TEMP\_1}$ 606 that is less than the junction temperature limit indicates that the decreased thermal impedance between the flexible heat spreader 208 and the integrated circuit 204 is not needed at this time, so as to not further increase the transfer of thermal energy from the integrated circuit. Thus, switching the actuator 210 to the first actuation mode in this case may provide for reducing the temperature of the second component, while still keeping the temperature of the integrated circuit at or below the junction temperature limit.

Figure 7:
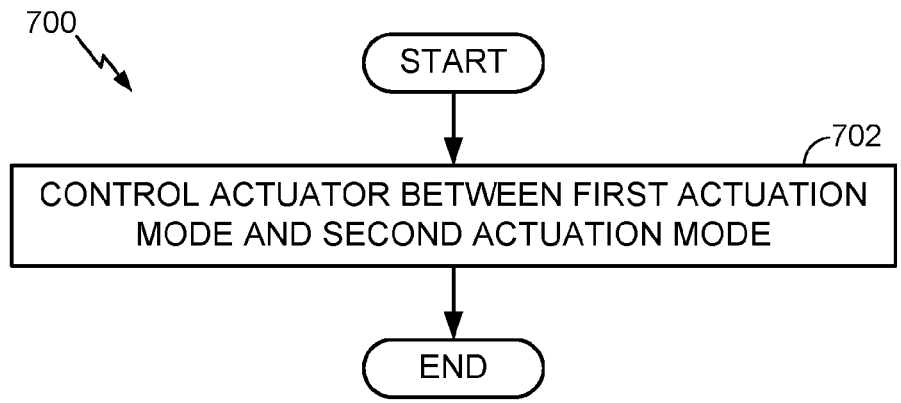
FIG. 7 illustrates an example process of thermally modulating an electronic device, according to aspects of the disclosure.

FIG. 7 illustrates an example process 700 of thermally modulating an electronic device, according to aspects of the disclosure. Process 700 may be performed by electronic devices 100A or 100B of FIG. 1, electronic device 200 of FIG. 2, electronic device 300 of FIG. 3, and/or electronic device 400 of FIG. 4.

In process block 702, a controller, such as controller 502 or 602, controls the actuator 210 between a first actuation mode and a second actuation mode. As shown in the example of FIGS. 2A and 3A, when in the first actuation mode, the actuator 210 positions the flexible heat spreader 208 with an air gap 220 between the flexible heat spreader 208 and the integrated circuit 204 such that the flexible heat spreader 208 is thermally separated from the integrated circuit 204 to increase a thermal impedance between the flexible heat spreader 208 and the integrated circuit 204. Similarly, with reference to FIGS. 2B and 3B, when in the second actuation mode, the actuator 210 positions the flexible heat spreader 208 in thermal contact with the integrated circuit 204 without the air gap 220 there between to reduce the thermal impedance between the flexible heat spreader 208 and the integrated circuit 204.

Figure 8:
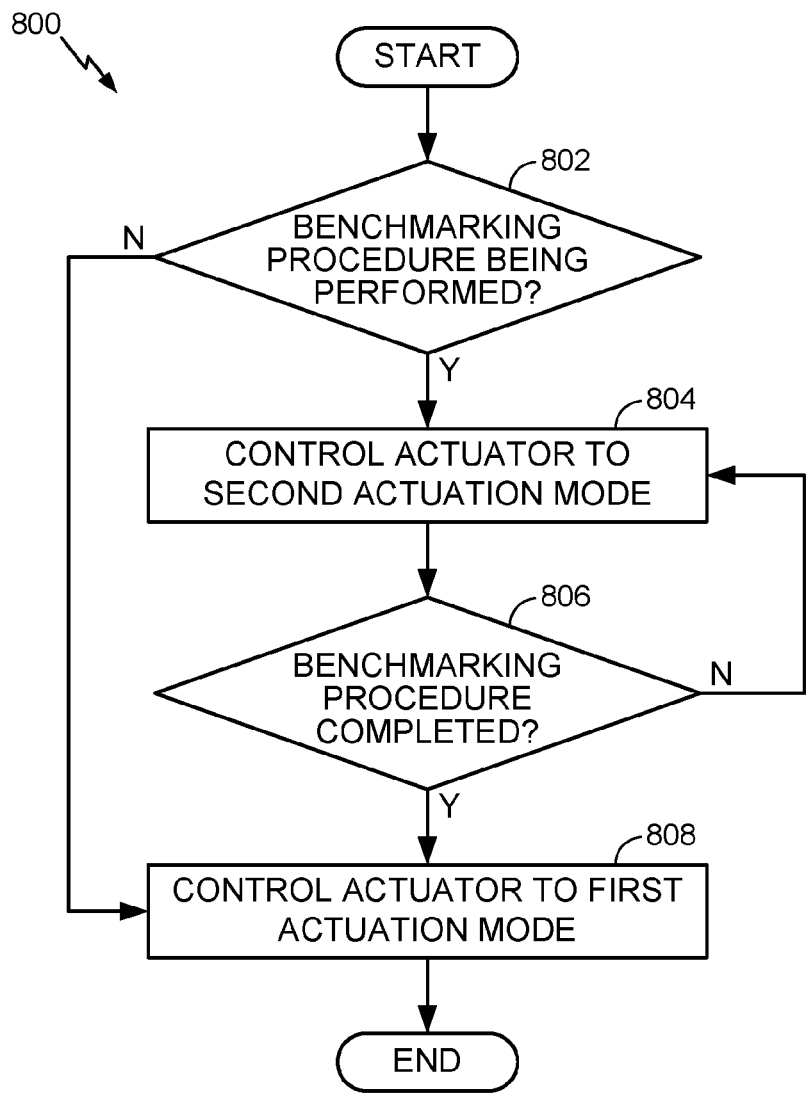
FIG. 8 illustrates an example process of thermally modulating an electronic device during a benchmarking procedure, according to aspects of the disclosure.

FIG. 8 illustrates an example process 800 of thermally modulating an electronic device during a benchmarking procedure, according to aspects of the disclosure. Process 800 is one possible implementation of process block 702 of process 700.

In a decision block 802, the electronic device (e.g., electronic device 400) determines whether a benchmarking procedure is being performed. As described with reference to the example of FIG. 5A, the controller 502 may receive a benchmarking signal $U_{BENCHMARK}$ 506 that indicates whether the benchmarking procedure is being performed. If the benchmarking signal $U_{BENCHMARK}$ 506 indicates that the benchmarking procedure is indeed being performed, then process 800 proceeds to process block 804, where the controller 502 controls the actuator 210 to the second actuation mode (e.g., FIG. 5B). Next, in decision block 806, the electronic device determines whether the benchmarking procedure has been completed (e.g., based on the benchmarking signal $U_{BENCHMARK}$ 506). If not, process 800 returns to process block 804, where the controller 502 maintains the actuator 210 in the second actuation mode. If however, in decision block 806 it is determined that the benchmarking procedure has completed, then process 800 then proceeds to process block 808, where controller 502 controls the actuator 210 back the first actuation mode (e.g., FIG. 5A).

As shown in FIG. 8, if in decision block 802 it is determined that no benchmarking procedure is being performed, then the controller 502 may control the actuator 210 to keep the actuator 210 in the first actuation mode.

Figure 9:
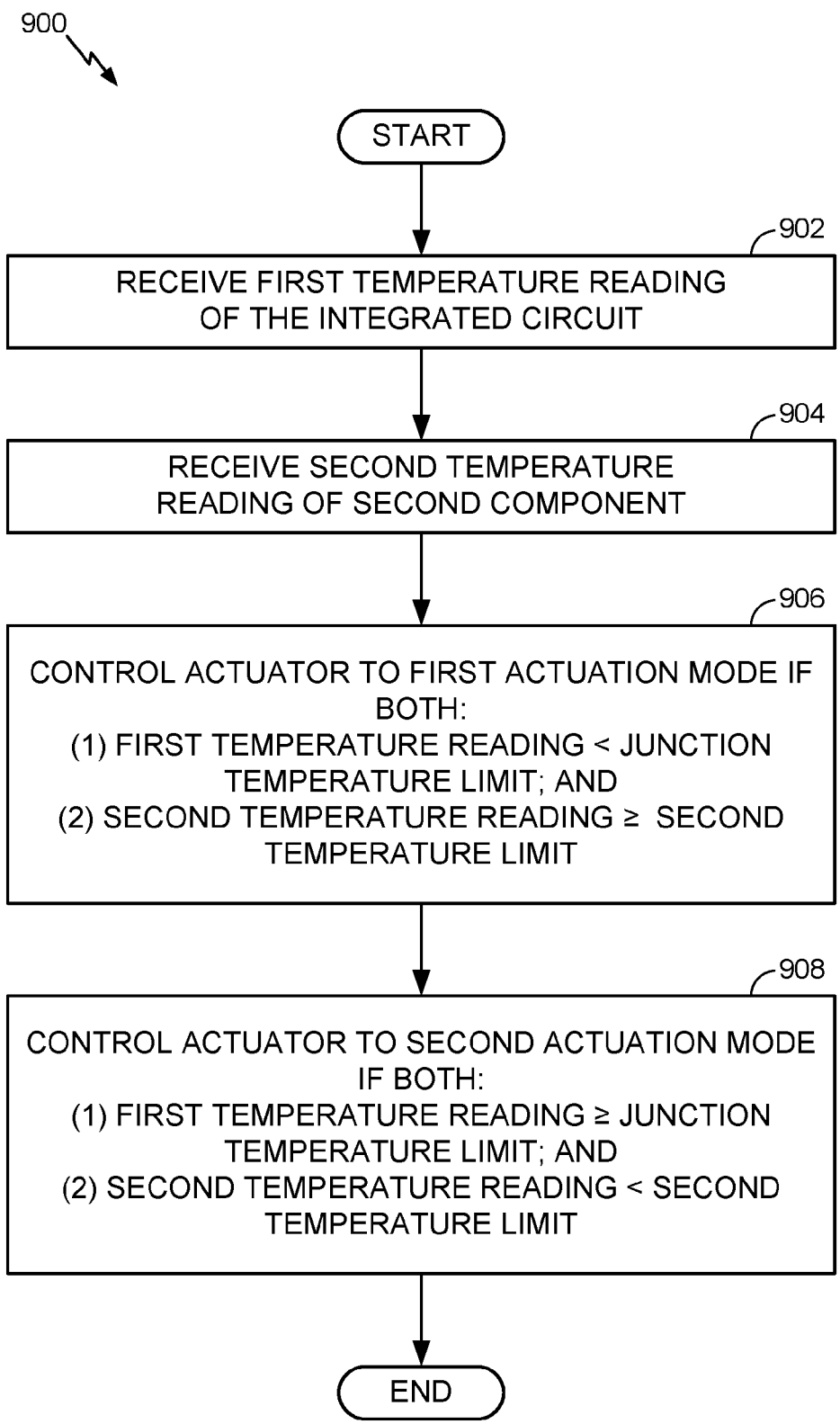
FIG. 9 illustrates an example process of thermally modulating an electronic device in response to one or more temperature readings, according to aspects of the disclosure.

FIG. 9 illustrates an example process 900 of thermally modulating an electronic device in response to one or more temperature readings, according to aspects of the disclosure. Process 900 is one possible implementation of process block 702 of process 700.

In a process block 902, the controller 602 of FIGS. 6A and 6B, receives a first temperature reading $U_{TEMP\_1}$ 606 of the integrated circuit 204. In a process block 904, the controller 602 receives a second temperature reading $U_{TEMP\_2}$ 608 of a second component (e.g., exterior housing 212) of the electronic device. In process block 906, the controller 602 controls the actuator 210 to the first actuation mode (e.g., FIG. 6A) if both: (1) the first temperature reading $U_{TEMP\_1}$ 606 is less than the junction temperature limit of the integrated circuit 204; and (2) the second temperature reading $U_{TEMP\_2}$ 608 is greater than or equal to a second temperature limit (i.e., skin temperature limit) associated with the second component.

In a process block 908, the controller 602 controls the actuator 210 to the second actuation mode (e.g., FIG. 6B) if both: (1) the first temperature reading $U_{TEMP\_1}$ 606 is greater than or equal to the junction temperature limit of the integrated circuit 204; and (2) the second temperature reading $U_{TEMP\_2}$ 608 is less than a second temperature limit (i.e., skin temperature limit) associated with the second component.

Figure 10:
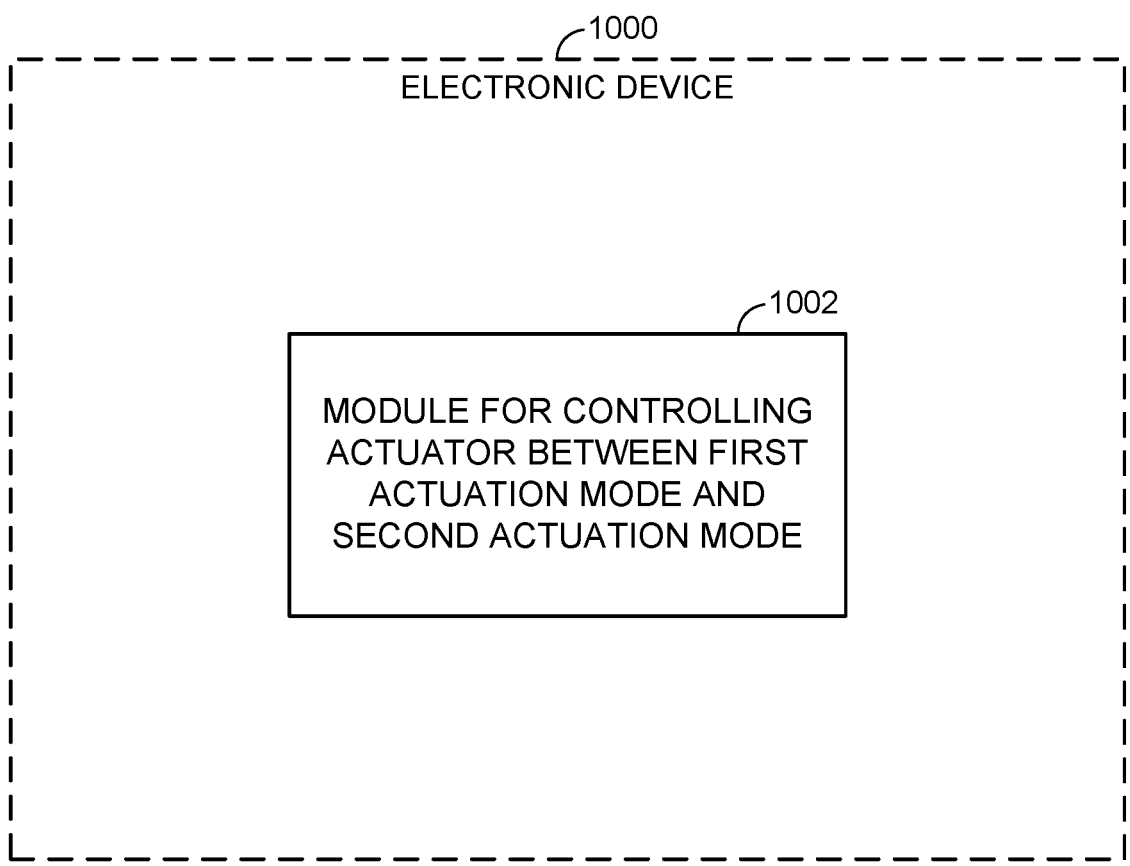
FIG. 10 illustrates sample aspects of components that may be employed in an electronic device configured to support the thermal modulation of the electronic device, according to aspects of the disclosure.

FIG. 10 illustrates sample aspects of components that may be employed in an electronic device 1000 configured to support the thermal modulation of the electronic device, according to aspects of the disclosure. Electronic device 1000 is one possible implementation of electronic devices 100A or 100B of FIG. 1, electronic device 200 of FIG. 2, electronic device 300 of FIG. 3, and/or electronic device 400 of FIG. 4.

A module 1002 for controlling an actuator between a first actuation mode and a second actuation mode may correspond at least in some aspects to, for example, an ASIC 108 of FIG. 1, a memory 112 of FIG. 1, a controller 502 of FIG. 5, and/or a controller 602 of FIG. 6. The functionality of the module 1002 may be implemented in various ways consistent with the teachings herein. In some designs, the functionality of module 1002 may be implemented as one or more electrical components. In some designs, the functionality of module 1002 may be implemented as a processing system including one or more processor components. In some designs, the functionality of module 1002 may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIG. 10, as well as other components and functions described herein, may be implemented using any suitable means. Such means also may be implemented, at least in part, using corresponding structure as taught herein. For example, the components described above in conjunction with the "module for" components of FIG. 10 also may correspond to similarly designated "means for" functionality. Thus, in some aspects, one or more of such means may be implemented using one or more of processor components, integrated circuits, or other suitable structure as taught herein.

Further, those of skill in the art will appreciate that the various illustrative logical blocks, modules, circuits, and algorithm steps described in connection with the embodiments disclosed herein may be implemented as electronic hardware or a combination of computer software and electronic hardware. To clearly illustrate this interchangeability of hardware and hardware-software combinations, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a non-transitory computer readable media embodying a method for thermally modulating an electronic device. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An electronic device, comprising:
an integrated circuit;
a flexible heat spreader;
an actuator coupled to the flexible heat spreader; and
a controller coupled to the actuator and configured to control the actuator between a first actuation mode and a second actuation mode, wherein:
when in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit,
when in the second actuation mode, the actuator positions the flexible heat spreader in thermal contact with the integrated circuit without the air gap therebetween to reduce the thermal impedance between the flexible heat spreader and the integrated circuit,
the controller is configured to receive a first temperature reading of the integrated circuit and a second temperature reading of a second component of the electronic device, and wherein the controller is configured to switch the actuator to the second actuation mode if both the first temperature reading is greater than or equal to a junction temperature limit of the integrated circuit and the second temperature reading of the second component, and
the controller is configured to switch the actuator back to the first actuation mode if both the first temperature reading is less than a junction temperature limit of the integrated circuit and the second temperature reading of the second component is greater than or equal to a second temperature limit associated with the second component.

2. The electronic device of claim 1, further comprising:
thermal interface material (TIM) disposed on and in thermal contact with the integrated circuit, wherein:
when in the first actuation mode, the actuator positions the flexible heat spreader with the air gap between the flexible heat spreader and the TIM such that the flexible heat spreader is physically separated from the TIM to increase the thermal impedance between the flexible heat spreader and the integrated circuit, and
when in the second actuation mode, the actuator positions the flexible heat spreader in physical contact with the TIM without the air gap there between to reduce the thermal impedance between the flexible heat spreader and the integrated circuit.

3. The electronic device of claim 1, further comprising:
a thermal interface material (TIM) disposed on and in thermal contact with the flexible heat spreader, wherein:
when in the first actuation mode, the actuator positions the flexible heat spreader with the air gap between the TIM and the integrated circuit such that the TIM is physically separated from the integrated circuit to increase the thermal impedance between the flexible heat spreader and the integrated circuit, and
when in the second actuation mode, the actuator positions the flexible heat spreader such that the TIM is in physical contact with the integrated circuit without the air gap there between to reduce the thermal impedance between the flexible heat spreader and the integrated circuit.

4. The electronic device of claim 1, wherein the actuator comprises a piezo electric layer coupled to the flexible heat spreader.

5. The electronic device of claim 4, wherein the controller is configured to switch the actuator to the second actuation mode by applying an actuation voltage to the piezo electric layer and to switch the actuator to the first actuation mode by removing the actuation voltage from the piezo electric layer.

6. The electronic device of claim 5, wherein the piezo electric layer is configured to have a curved shape in response to the actuation voltage and to have a planar non-curved shape in the absence of the actuation voltage.

7. The electronic device of claim 1, wherein the flexible heat spreader comprises a structure configured to disperse heat generated by the integrated circuit, the structure selected from the group consisting of a graphite sheet, a metal sheet, a copper sheet, and a mid-frame of the electronic device.

8. The electronic device of claim 1, further comprising a thermal interface material (TIM) disposed between the flexible heat spreader and the integrated circuit, wherein when in the second actuation mode, the actuator applies a force against the flexible heat spreader to reduce a contact impedance between the TIM and the integrated circuit.

9. The electronic device of claim 1, further comprising an exterior housing of the electronic device, wherein:
when in the first actuation mode, the actuator positions the flexible heat spreader to maintain a temperature of the exterior housing to less than a skin temperature limit of the exterior housing, and
when in the second actuation mode, the actuator positions the flexible heat spreader to maintain a temperature of the integrated circuit to less than a junction temperature limit of the integrated circuit.

10. The electronic device of claim 1, wherein the second component is an exterior housing of the electronic device.

11. The electronic device of claim 1, wherein the second component is an exterior housing of the electronic device.

12. The electronic device of claim 1, wherein the integrated circuit comprises a mobile station modem (MSM) integrated circuit of the electronic device.

13. The electronic device of claim 1, wherein the controller is configured to switch the actuator from the first actuation mode to the second actuation mode during a benchmarking procedure performed by the electronic device and to switch the actuator back to the first actuation mode upon completion of the benchmarking procedure.

14. A method of thermally modulating an electronic device that includes an integrated circuit, a flexible heat spreader, and an actuator, the method comprising:
controlling the actuator between a first actuation mode and a second actuation mode, wherein:
when in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit, and
when in the second actuation mode, the actuator positions the flexible heat spreader in thermal contact with the integrated circuit without the air gap there between to reduce the thermal impedance between the flexible heat spreader and the integrated circuit;
receiving a first temperature reading of the integrated circuit;
receiving a second temperature reading of a second component of the electronic device; and
switching the actuator to the first actuation mode in response to both the first temperature reading being less than a junction temperature limit of the integrated circuit and the second temperature reading of the second component being greater than or equal to a second temperature limit associated with the second component; and
switching the actuator to the second actuation mode in response to both the first temperature reading being greater than or equal to a junction temperature limit of the integrated circuit and the second temperature reading of the second component being less than a second temperature limit associated with the second component.

15. The method of claim 14, wherein the second component is an exterior housing of the electronic device.

16. The method of claim 14, further comprising:
switching the actuator from the first actuation mode to the second actuation mode during a benchmarking procedure performed by the electronic device; and
switching the actuator back to the first actuation mode upon completion of the benchmarking procedure.

17. An electronic device, comprising:
an integrated circuit;
a heat spreading means for dispersing heat generated by the integrated circuit;
an actuator means for positioning the heat spreading means in a first position while in a first actuation mode and in a second position while in a second actuation mode; and a means for controlling the actuator means between the first actuation mode and the second actuation mode, wherein
    when in the first actuation mode, the first position comprises the flexible heat spreader positioned with an air gap between the flexible heat spreader and the integrated circuit such that the flexible heat spreader is thermally separated from the integrated circuit to increase a thermal impedance between the flexible heat spreader and the integrated circuit, and
    when in the second actuation mode, the second position comprises the flexible heat spreader positioned in thermal contact with the integrated circuit without the air gap there between to reduce the thermal impedance between the flexible heat spreader and the integrated circuit;
means for receiving a first temperature reading of the integrated circuit;
means or receiving a second temperature reading of a second component of the electronic device; and
means for switching the actuator means to the first actuation mode in response to both the first temperature reading being less than a junction temperature limit of the integrated circuit and the second temperature reading of the second component being greater than or equal to a second temperature limit associated with the second component; and
means for switching the actuator means to the second actuation mode in response to both the first temperature reading being greater than or equal to a junction temperature limit of the integrated circuit and the second temperature reading of the second component being less than a second temperature limit associated with the second component.

18. The electronic device of claim 17, further comprising:
a thermal interface material (TIM) disposed on and in thermal contact with the integrated circuit, wherein
    when in the first actuation mode, the actuator means positions the heat spreading means with the air gap between the heat spreading means and the TIM such that the heat spreading means is physically separated from the TIM to increase the thermal impedance between the heat spreading means and the integrated circuit, and
    when in the second actuation mode, the actuator means positions the heat spreading means in physical contact with the TIM without the air gap there between to reduce the thermal impedance between the heat spreading means and the integrated circuit.

19. The electronic device of claim 17, further comprising:
a thermal interface material (TIM) disposed on and in thermal contact with the heat spreading means, wherein
    when in the first actuation mode, the actuator means positions the heat spreading means with the air gap between the TIM and the integrated circuit such that the TIM is physically separated from the integrated circuit to increase the thermal impedance between the heat spreading means and the integrated circuit, and
    when in the second actuation mode, the actuator means positions the heat spreading means such that the TIM is in physical contact with the integrated circuit without the air gap there between to reduce the thermal impedance between the heat spreading means and the integrated circuit.

20. A wireless mobile station, comprising:
an integrated circuit disposed within an exterior housing of the wireless mobile station;
a flexible heat spreader comprising a structure configured to disperse heat generated by the integrated circuit to at least the exterior housing, the structure selected from the group consisting of a graphite sheet, a metal sheet, a copper sheet, and a mid-frame of the wireless mobile station;
an actuator comprising a piezo electric layer coupled to the flexible heat spreader; and
a controller coupled to the actuator and configured to control the actuator between a first actuation mode and a second actuation mode, wherein the controller is configured to switch the actuator to the second actuation mode by applying an actuation voltage to the piezo electric layer and to switch the actuator to the first actuation mode by removing the actuation voltage from the piezo electric layer, wherein:
    when in the first actuation mode, the actuator positions the flexible heat spreader with an air gap between the flexible heat spreader and the integrated circuit such that the flexible heat spreader is thermally separated from the integrated circuit to increase a thermal impedance between the flexible heat spreader and the integrated circuit, wherein the piezo electric layer is configured to have a planar non-curved shape when the actuator is in the first actuation mode,
    when in the second actuation mode, the actuator positions the flexible heat spreader in thermal contact with the integrated circuit without the air gap there between to reduce the thermal impedance between the flexible heat spreader and the integrated circuit, wherein the piezo electric layer is configured to have a curved shape when the actuator is in the second actuation mode,
    the controller is configured to receive a first temperature reading of the integrated circuit and a second temperature reading of the exterior housing,
    the controller is configured to switch the actuator to the second actuation mode if both the first temperature reading is greater than or equal to a junction temperature limit of the integrated circuit and the second temperature reading of the exterior housing is less than a second temperature limit associated with the exterior housing, and
    the controller is configured to switch the actuator to the first actuation mode if both the first temperature reading is less than a junction temperature limit of the integrated circuit and the second temperature reading of the exterior housing is greater than or equal to a second temperature limit associated with the exterior housing.

21. The wireless mobile station of claim 20, wherein the integrated circuit comprises a mobile station modem (MSM) integrated circuit of the wireless mobile station.

22. The wireless mobile station of claim 20, further comprising:
a thermal interface material (TIM) disposed on and in thermal contact with the integrated circuit, wherein
    when in the first actuation mode, the actuator positions the flexible heat spreader with the air gap between the flexible heat spreader and the TIM such that the flexible heat spreader is physically separated from the TIM to increase the thermal impedance between the flexible heat spreader and the integrated circuit, and when in the second actuation mode, the actuator positions the flexible heat spreader in physical contact with the TIM without the air gap there between to reduce the thermal impedance between the flexible heat spreader and the integrated circuit.

23. The wireless mobile station of claim 20, further comprising:
a thermal interface material (TIM) disposed on and in thermal contact with the flexible heat spreader, wherein
when in the first actuation mode, the actuator positions the flexible heat spreader with the air gap between the TIM and the integrated circuit such that the TIM is physically separated from the integrated circuit to increase the thermal impedance between the flexible heat spreader and the integrated circuit, and
when in the second actuation mode, the actuator positions the flexible heat spreader such that the TIM is in physical contact with the integrated circuit without the air gap there between to reduce the thermal impedance between the flexible heat spreader and the integrated circuit.

24. The wireless mobile station of claim 20, wherein the controller is configured to switch the actuator from the first actuation mode to the second actuation mode during a benchmarking procedure performed by the wireless mobile station and to switch the actuator back to the first actuation mode upon completion of the benchmarking procedure.

* * * * *